United States Patent
Loeckenhoff

(10) Patent No.: US 11,073,306 B2
(45) Date of Patent: Jul. 27, 2021

(54) LENS, SOLAR CELL UNIT AND JOINING METHOD FOR A SOLAR CELL UNIT

(71) Applicant: AZUR SPACE Solar Power GmbH, Heilbronn (DE)

(72) Inventor: Ruediger Loeckenhoff, Bietigheim-Bissingen (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 81 days.

(21) Appl. No.: 16/360,814

(22) Filed: Mar. 21, 2019

(65) Prior Publication Data

US 2019/0219306 A1    Jul. 18, 2019

Related U.S. Application Data

(63) Continuation of application No. PCT/EP2017/000845, filed on Jul. 14, 2017.

(30) Foreign Application Priority Data

Sep. 21, 2016    (DE) .................... 10 2016 011 320.0

(51) Int. Cl.
   *F24S 23/30* (2018.01)
   *H01L 31/054* (2014.01)
   (Continued)

(52) U.S. Cl.
   CPC .............. *F24S 23/30* (2018.05); *G02B 7/022* (2013.01); *G02B 19/0042* (2013.01);
   (Continued)

(58) Field of Classification Search
   CPC ..... F24S 23/30; H01L 31/0543; H01L 31/048; H01L 31/05; H01L 31/18; G02B 7/022; G02B 19/0042; Y02E 10/52
   See application file for complete search history.

(56) References Cited

U.S. PATENT DOCUMENTS 4,830,678 A  *  5/1989  Todorof ............. H01L 31/0543
                                                         136/259
6,055,111 A  *  4/2000  Nomura ........... B29D 11/00413
                                                         359/642
(Continued)

FOREIGN PATENT DOCUMENTS

DE       102009006286 A1    1/2009
EP            1953825 A2    8/2008
(Continued)

OTHER PUBLICATIONS

International Search Report dated Oct. 30, 2017 in corresponding application PCT/EP2017/000845.

*Primary Examiner* — Collin X Beatty
(74) *Attorney, Agent, or Firm* — Muncy, Geissler, Olds & Lowe, P.C.

(57) ABSTRACT

A lens, a solar cell unit including the lens and a joining method for the solar cell unit, wherein the lens has a main body with a substantially planar base, a receiving surface opposite the base, a side surface area connecting the base and the receiving surface and an optical axis extending perpendicular to the base and at least one bulge is arranged on the main body of the lens at a first height above the base on the side surface area.

14 Claims, 2 Drawing Sheets

(51) Int. Cl.
  H01L 31/18 (2006.01)
  G02B 19/00 (2006.01)
  G02B 7/02 (2021.01)
  H01L 31/048 (2014.01)
  H01L 31/05 (2014.01)

(52) U.S. Cl.
  CPC ............ H01L 31/048 (2013.01); H01L 31/05 (2013.01); H01L 31/0543 (2014.12); H01L 31/18 (2013.01); *Y02E 10/52* (2013.01)

(56) References Cited

U.S. PATENT DOCUMENTS

| | | | | |
|---|---|---|---|---|
| 7,264,378 B2* | 9/2007 | Loh | .................... | H01L 33/58 |
| | | | | 257/100 |
| 7,456,499 B2* | 11/2008 | Loh | .................... | H01L 33/644 |
| | | | | 257/710 |
| 8,075,165 B2* | 12/2011 | Jiang | .................... | F21K 9/64 |
| | | | | 362/308 |
| 8,093,492 B2 | 1/2012 | Hering et al. | | |
| 10,211,358 B2 | 2/2019 | Loeckenhoff | | |
| 10,732,488 B2* | 8/2020 | Hwang | .................... | H04N 5/2252 |
| 2008/0212198 A1* | 9/2008 | Kuwa | .................... | C03B 11/08 |
| | | | | 359/642 |
| 2009/0078950 A1* | 3/2009 | Sun | .................... | G02B 19/0061 |
| | | | | 257/98 |
| 2009/0199891 A1 | 8/2009 | Hering et al. | | |
| 2010/0091491 A1 | 4/2010 | Jiang et al. | | |
| 2010/0132793 A1 | 6/2010 | Nakamua et al. | | |
| 2011/0067758 A1 | 3/2011 | Plesniak | | |
| 2011/0247684 A1* | 10/2011 | Huang | .................... | H01L 31/0543 |
| | | | | 136/256 |
| 2012/0182624 A1* | 7/2012 | Itou | .................... | B29D 11/00432 |
| | | | | 359/642 |
| 2013/0242406 A1* | 9/2013 | Kobayashi | .................... | B29D 11/00009 |
| | | | | 359/642 |
| 2013/0319507 A1* | 12/2013 | Hasin | .................... | H05K 1/0203 |
| | | | | 136/246 |
| 2014/0318622 A1 | 10/2014 | Szczepanik | | |
| 2016/0039190 A1 | 2/2016 | Lee et al. | | |
| 2017/0261723 A1* | 9/2017 | Sun | .................... | G02B 13/009 |

FOREIGN PATENT DOCUMENTS

| | | |
|---|---|---|
| EP | 2073279 A1 | 6/2009 |
| EP | 2722701 A1 | 4/2014 |
| EP | 2950353 A1 | 12/2015 |
| WO | WO2013083997 A2 | 6/2013 |
| WO | WO2013173212 A1 | 11/2013 |

* cited by examiner

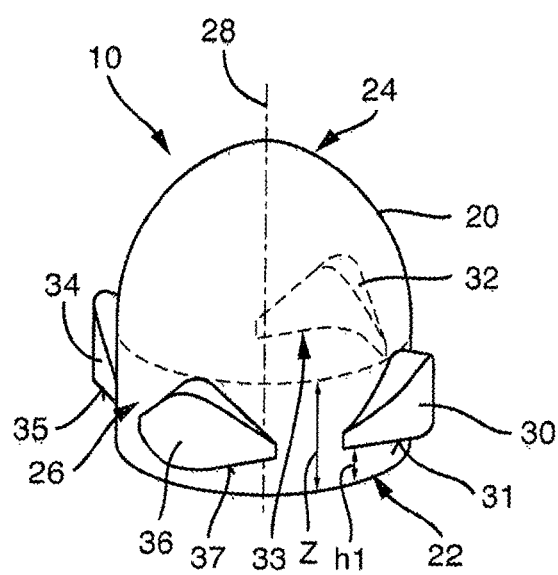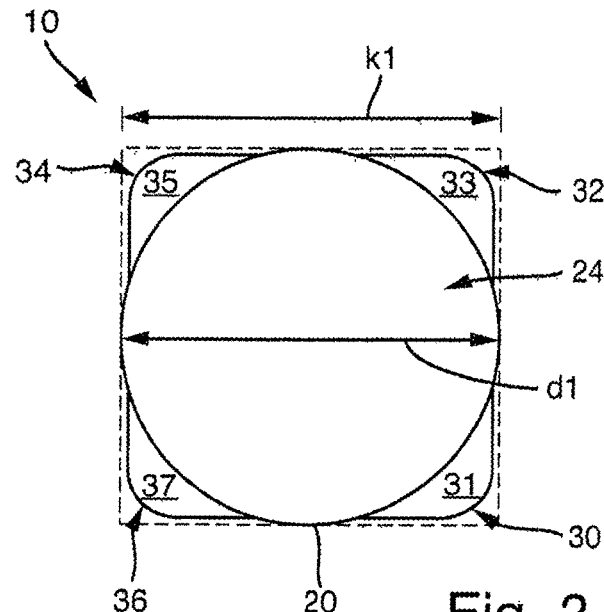
Fig. 1
Fig. 2
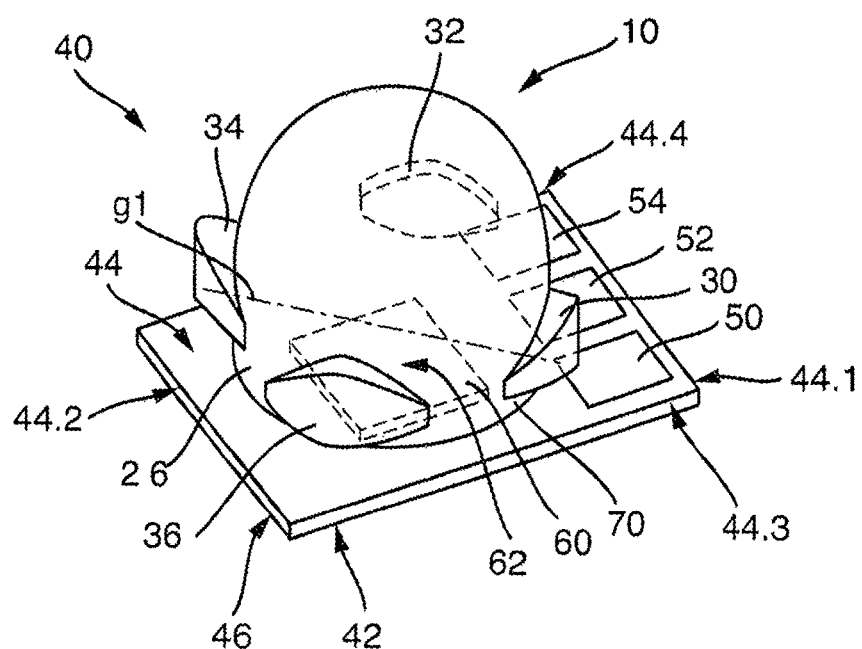
Fig. 3

US 11,073,306 B2

LENS, SOLAR CELL UNIT AND JOINING METHOD FOR A SOLAR CELL UNIT

This nonprovisional application is a continuation of International Application No. PCT/EP2017/000845, which was filed on Jul. 14, 2017, and which claims priority to German Patent Application No. 10 2016 011 320.0, which was filed in Germany on Sep. 21, 2016, and which are both herein incorporated by reference.

BACKGROUND OF THE INVENTION

Field of the Invention

The present invention relates to a lens, a solar cell unit comprising the lens and a joining method for a solar cell unit.

Description of the Background Art

From EP 2 073 279 A1, a solar cell module is known in which a semiconductor body designed as a solar cell is arranged on a support. In order to protect the semiconductor body, and in particular its side surfaces, against environmental influences which lead to a degradation of the electrical parameters, a frame is arranged surrounding the semiconductor body on three sides and closed with a transparent cover. Subsequently, the remaining space is filled with a transparent potting compound, and a lens is attached.

From EP 1 953 825 A2, which corresponds to U.S. Pat. No. 7,264,378, a further solar cell unit is known. In this case, a semiconductor body designed as a solar cell is arranged on a support. Subsequently, for protection of the semiconductor body, a sealing film and a housing formed of several parts, which includes a lens, are disposed on the support in a multi-stage process.

From DE 10 2009 006 286 A1, which corresponds to U.S. Pat. No. 8,093,492, a solar cell module is known, which comprises a plurality of individual solar cell units on a support. Inter alia, a lens, which is also referred to as a secondary optical element "SOE", is disposed above each solar cell. The optical element directs the sunlight focused by a Fresnel lens onto the surface of the solar cell. By means of the focusing arrangement, large-scale solar cell units can be built with a small number of solar cells, which have an efficiency of up to 40% and above.

Further solar cell units are known from US 2011/0247684 A1, US 2011/00667758 A1, US 2016/0039190 A1, WO 2013/083997 A2, WO 2013/173212 A1 and EP 2 950 353 A1, which corresponds to US 2015/0349179, which is incorporated herein by reference. From EP 2 722 701 A1, an optical system for a sensor is known.

SUMMARY OF THE INVENTION

It is therefore an object of the present invention to provide a device that further develops the prior art.

According to an exemplary embodiment of the invention, a lens is provided, wherein the lens has a main body with a substantially planar or completely planar base, a receiving surface opposite the base, a side surface area connecting the base and the receiving surface, and an optical axis extending perpendicular to the base.

Furthermore, at a first height above the base on the side surface area, the lens has at least one bulge, wherein the bulge has a bottom and the bottom of the bulge is spaced from the bottom of the receiving surface in the direction of the optical axis.

The at least one bulge covers an angular range of less than 130° of the circumference of the main body as measured from the optical axis. For example, the bulge can cover an angular range between 5° and 40°. Most preferably, the bulge covers an angular range of less than 60°.

It should be noted that in one embodiment, the concept of the planar surface on the base also includes a microroughness. In this case, in particular a roughness depth between 0.0001 mm and 0.1 mm is involved. It should also be noted that the terms lens and secondary optical element can be used synonymously.

Such lenses as part of a solar cell unit are used particularly in concentrating solar systems. The systems consisting of a solar cell unit and a Fresnel lens are also referred to as CPV systems and include concentration factors of several hundred to over 1000. The solar cell preferably includes 3-5 semiconductor materials formed as a monolithic, integrated, stacked multi-junction solar cell.

According to a further object of the invention, a solar cell unit with a lens of the type described above is provided, wherein the solar cell unit has a semiconductor body formed as a solar cell, having a receiving surface, a base and at least two electrical contacts, and a support with a top and a bottom, wherein the base of the semiconductor body is electrically and frictionally connected with the top of the support, and the base of the lens is frictionally connected with the receiving surface of the semiconductor body by means of a polymer adhesive layer comprising a silicone compound.

Another object of the invention is a joining method for a solar cell unit. A lens and a semi-finished product are provided for this purpose.

The lens has a main body with a substantially planar or completely planar base, a receiving surface opposite the base, a side surface area connecting the base and the receiving surface, and an optical axis extending perpendicular to the base. On the main body of the lens, at least one bulge is further disposed at a first height above the base on the side surface area.

The bulge has a bottom, wherein the bottom of the bulge is spaced from the base of the main body in the direction of the optical axis. Preferably, the surface on the bottom of the bulge is planar and parallel to the surface on the base of the lens.

The semi-finished product comprises a support having a top and a bottom, wherein at least two contact surfaces and a semiconductor body formed as a solar cell are arranged on the top of the support.

With an upward-pointing base of the lens, the lens is positively held in a holder on at least one bulge or on a plurality or by means of all bulges. A polymer adhesive layer comprising a silicone compound is applied to the base of the lens.

Subsequently, the semi-finished product is placed on the base of the lens covered by the polymer adhesive layer in such a way that a centroid of the lens base, also referred to as the secondary optical element, and a centroid of a receiving surface of the semiconductor body are at least approximately or preferably exactly superimposed.

Subsequently, the semi-finished product positioned on the lens is held on the lens at a defined distance and is heated, so that after the polymer adhesive layer has cured, a frictional connection between the base of the lens and the receiving surface of the semiconductor body is created.

The lens can be formed of a non-organic compound and most preferably is transparent at least for a wavelength range from infrared, and up to and including the proximal ultraviolet. Preferably, the secondary optical element is completely made of a quartz glass compound or of quartz glass.

An advantage of the device according to the invention is that by means of the bulge, the lens is joined in an accurately aligned manner and positioned relative to the receiving surface having the semiconductor body. As a result, the degree of efficiency and the reliability of the solar cell unit are increased.

By the bulges covering an angular range of less than 130° and the bulges being limited to a square area determined by the diameter of the lens, a simple and reliable holding and positioning of the lens becomes possible, e.g. during a joining process, without significantly increasing the size of the lens that is necessary for the imaging properties or the size of a component comprising the lens.

Studies have shown that with the inventive method, automated production with a high yield of large quantities is possible. It is of particular advantage that, when applying the polymer adhesive layer to the base of the lens, the bulges are not wetted and the receiving device for the lens is not contaminated. By means of surface forces, the wetting of the silicone drop that is still liquid prior to joining is limited to the base of the main body.

Another advantage is that the inventive bulges do not or only slightly increase the space requirement of the lens. In particular, a matrix arrangement of solar cells comprising the lens as a secondary optical element is possible on a PCB cluster.

The lens can have exactly two or three or exactly four bulges. In one development, the exactly two or exactly three or exactly four bulges or the more than four bulges can be evenly distributed along a periphery running parallel to the base of the main body of the lens.

The bulges also may not be evenly distributed along a periphery running parallel to the base of the main body of the lens.

Further, all bulges can have the same first height. In another example, the four bulges can have different first heights.

In another development, in each case two of the four bulges can be closer together, i.e., the distance between two directly adjacent bulges is less than 90° in a direction along a periphery, while in the opposite direction, the angle can be greater than 90°.

Further, the exactly two or the exactly three or the exactly four bulges or the more than four bulges can have the same shape. Alternatively, at least some of the bulges have a different shape.

The base of the main body can have a diameter of no more than 3 cm or at most 1.5 cm, and a height of the main body along the optical axis is no more than 5 cm or at most 2 cm.

The lens can have a cylindrical or frustoconical side surface or, in other words, a cylindrical or frustoconical side surface area. Again, in other words, the side surface is substantially cylindrical in shape, wherein certain lens manufacturing processes, however, require a draft angle and thus a slight frustoconical shape.

The lens can have at least two different diameters in the area of the side surface. Preferably, the smaller diameter is formed in the vicinity of the base of the lens, i.e., a part of the lens adjoining the base of the lens tapers such that the projection of the base along the optical axis is a smaller subsurface of the projection of the main body along the optical axis. Preferably, in this case the diameter of the cylindrical side surface of the tapered portion in the direction of the optical axis is of equal size.

The diameter of the cylindrical side surface or the tapered portion in the direction of the optical axis can increases or decreases.

In particular, in a matrix-like arrangement of a plurality of lenses, the distance between the base of the lenses is thereby increased without enlarging the entire arrangement. The greater distance facilitates a clean application of the polymer adhesive layer.

The lens can comprises a quartz glass compound and can be integrally formed.

In another development, a shadow of the main body in a projection along the optical axis has a first diameter D, wherein a shadow of the lens formed of the main body and the at least one bulge in a projection along the optical axis fits completely in a square with an edge length corresponding to the first diameter D.

In a further embodiment, the base of the lens can be circular, the receiving surface can be convex, and the side surface area can have a circular circumference.

According to another embodiment, the main body of the lens can be designed as an inverted truncated pyramid with a square base and a square receiving surface.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 is a schematic view of an exemplary embodiment of a lens according to the invention, FIG. 2 is a schematic plan view of the embodiment of the lens according to the invention, FIG. 3 is a schematic view of an exemplary embodiment of a solar cell unit having the lens according to the invention.

DETAILED DESCRIPTION

Figure 4:
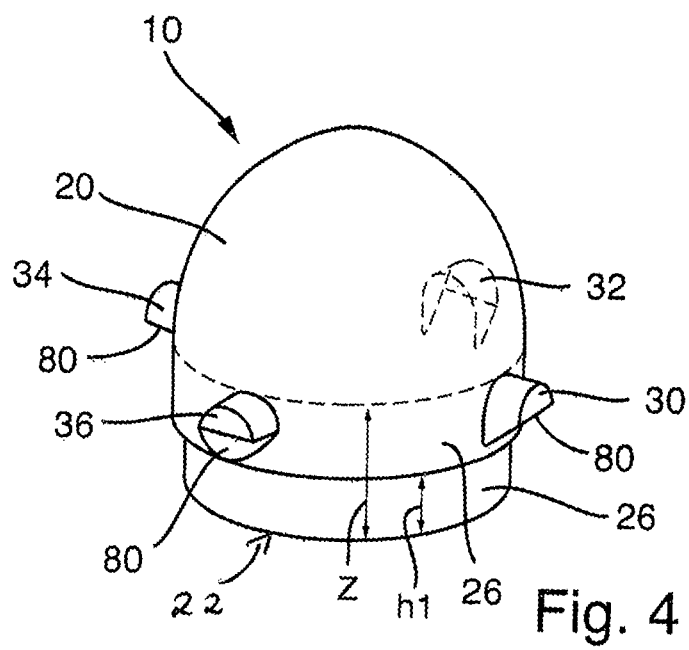
FIG. 4 is a schematic view of an exemplary embodiment of a lens according to the invention.

FIGS. 1 and 2 show a perspective view and a plan view of a first embodiment of a lens 10 according to the invention. The lens 10 consists of a main body 20 and four bulges 30, 32, 34, 36. The main body has a planar base 22, a convex receiving surface 24 opposite the base 22, and a cylindrical side surface area 26 with a height Z connecting the base 22 and the receiving surface 24, wherein an optical axis 28 of the main body 20 runs perpendicular to the base 22. The height Z is formed between a dotted auxiliary line and the base of the lens 10.

All four bulges 30, 32, 34, 36 have the same shape and are arranged at a first height h1 above the base 22 on the side surface area 26. The four bulges 30, 32, 34, 36 are distributed uniformly around the circumference of the cylindrical side surface area 26 of the main body 20. The plan view of FIG. 2 shows that the bulges 30, 32, 34, 36 each protrude in a projection along the optical axis 28 beyond the main body 20. It should be noted that the height h1 is smaller than the height Z of the surface area 26.

In the projection, the main body 20 has a circular outer contour with a diameter d1. The four evenly distributed bulges 30, 32, 34 and 36 are formed such in the illustrated embodiment that four evenly distributed bulges 30, 32, 34 and 36 augment the outer contour of the lens 10 in the projection to a square with rounded corners, wherein the one edge length k1 of the square is smaller than or equal to the diameter d1 of the main body 20. In this case, it should be noted that in the case of k1 smaller than d1, the square with the rounded corners has a circular segmental extension in the middle of each side surface due to the combination with the circular projection surface of the main body.

The existing diameter d1 of the cylindrical side surface in the direction of the optical axis is of equal size, but it should be noted that in a non-illustrated embodiment, the diameter d1 of the cylindrical side surface increases or decreases in the optical axis direction.

In the illustration of FIG. 3, a first embodiment of a solar cell unit 40 having a lens 10 is shown. In the following, only the differences from the illustrations of FIGS. 1 and 2 are explained. The solar cell unit 40 has a support 42 with a top 44 and a bottom 46. On the top 44, three contact surfaces 50, 52, 54 are arranged along a first edge 44.1. Between the contact surfaces 50, 52, 54 and a second edge 44.2 opposite the first edge 44.1, a semiconductor body 60 designed as a solar cell having a receiving surface 62 is arranged.

The lens 10 shown in FIGS. 1 and 2 is frictionally connected to a receiving surface 62 of the semiconductor body 60 and a portion of the top 44 of the support 40 by means of a polymer adhesive layer 70 comprising a silicone compound, wherein the base of the lens is frictionally connected to the receiving surface of the semiconductor body by means of a polymer adhesive layer comprising a silicone compound.

The lens 10 is arranged on the support 42 in such a way that the bulges 30, 32, 34, 36 of the lens 10 point in each case to a corner of the support 42 or that a straight line g1 connecting two opposing bulges 30 and 34 with the second edge 44.2 forms an angle of 45°.

In the illustration of FIG. 4, a second embodiment of a lens 10 is shown. In the following, only the differences from the illustrations of FIGS. 1 and 2 are explained. The four bulges 30, 32, 34, 36 of the lens 10 have a semicircular upper part and a lower part 80 sloping down in the direction of the side surface area 26 of the main body 20 of the lens.

Furthermore, the diameter of the projection of the convex lens portion 20 along the optical axis is greater than the diameter of the base 22 of the lens.

Figure 5:
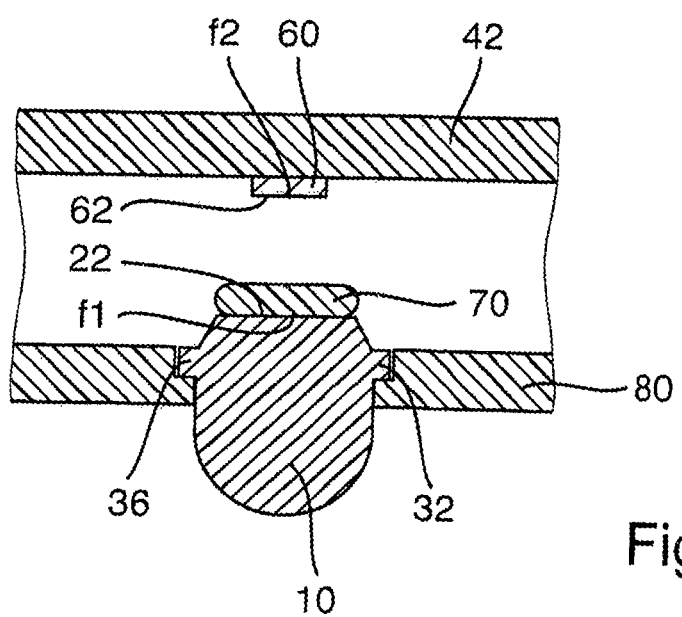
FIG. 5 is a schematic view of am exemplary embodiment of a joining method.

In the drawing of FIG. 5, a first embodiment of a joining method for a solar cell unit 40 is illustrated. With an upwardly pointing base 22, the lens 10 is held positively on the four bulges 30, 32, 34, 36 in a holder. The polymer adhesive layer 70 is applied to the base 22 of the lens 10.

A semi-finished product comprising the support 42 with the semiconductor body 60 and the three contacts 50, 52, 54 (not shown) is arranged such above the base 22 of the lens 10 covered by the polymer adhesive layer 70 that a centroid f1 of the base 22 of the lens 10 and a centroid f2 of a receiving surface 62 of the semiconductor body 60 are superimposed along the optical axis. Subsequently, the semi-finished product positioned above the lens 10 is approximated to the base 22 of the lens up to a defined gap size. The mount of silicone and the gap size are selected such that the silicone completely or at least partially fills the gap between the base 22 of the lens and the semi-finished product.

According to the embodiment shown in FIG. 4, the main body 20 of the lens tapers towards the base 22 of the main body.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A lens comprising:
a main body with a substantially planar base, a receiving surface opposite the base, a side surface area connecting the base and the receiving surface;
an optical axis extending substantially perpendicular to the base; and
at least one bulge arranged on the main body of the lens within the side surface area between the receiving surface and the planar base, the at least one bulge having a bottom spaced from the base of the main body in a direction of the optical axis,
wherein the at least one bulge covers an angular range of less than 130° of the circumference of the main body as measured from the optical axis,
wherein, in a projection along the optical axis, a shadow of the main body has a first diameter, and
wherein a shadow of the lens formed of the main body and the at least one bulge in a projection along the optical axis completely fits in a square having an edge length corresponding to the diameter.

2. The lens according to claim 1, wherein the lens has exactly two bulges or exactly three bulges or exactly four bulges.

3. The lens according to claim 1, wherein the lens has exactly four bulges, and
wherein the four bulges are evenly or not evenly distributed along a circumference of the main body of the lens extending parallel to the base.

4. The lens according to claim 1, wherein the base of the main body has a diameter of at most 3 cm or at most 1.5 cm, and a height of the main body along the optical axis is at most 5 cm or at most 2 cm.

5. The lens according to claim 1, wherein a portion of the lens aligned with the base tapers towards the base so that the projection of the base along the optical axis is a smaller subsurface of the projection of the main body along the optical axis.

6. The lens according to claim 1, wherein the lens comprises a quartz glass compound and is formed integrally.

7. A lens comprising:
a main body with a substantially planar base, a receiving surface opposite the base, a side surface area connecting the base and the receiving surface;
an optical axis extending substantially perpendicular to the base; and
at least one bulge arranged on the main body of the lens at a first height on the base on the side surface area, the at least one bulge having a bottom spaced from the base of the main body in a direction of the optical axis,
wherein the at least one bulge covers an angular range of less than 130° of the circumference of the main body as measured from the optical axis, wherein, in a projection along the optical axis, a shadow of the main body has a first diameter, wherein a shadow of the lens formed of the main body and the at least one bulge in a projection along the optical axis completely fits in a square having an edge length corresponding to the diameter, and wherein the base of the lens has a circular shape, the receiving surface of the lens is convex, and the side surface area of the lens has a circular circumference.

8. A solar cell unit comprising:
a lens according to claim 1;
a semiconductor body constructed as a solar cell with a receiving surface, a base and at least two electrical contacts; and
a support having a top and a bottom, wherein the base of the semiconductor body is electrically interconnected and frictionally connected to the top of the support,
wherein the base of the lens is frictionally connected with the receiving surface of the semiconductor body via a polymer adhesive layer or a silicone compound.

9. The solar cell unit according to claim 8, wherein the top of the support is rectangular with four edges,
wherein the lens has four bulges, and
wherein the lens is arranged on the support such that a straight line connecting two opposing bulges case forms an angle between 35° and 55° towards edges of the support.

10. The lens according to claim 1, wherein the base of the lens has a circular shape.

11. The lens according to claim 1, wherein the receiving surface of the lens is convex.

12. The lens according to claim 1, wherein the side surface area of the lens has a circular circumference.

13. A lens comprising:
a main body, comprising:
a base having a planar bottom surface;
a receiving surface opposite the base; and
a side surface area connecting the base and the receiving surface;
an optical axis extending perpendicular to the base; and
a bulge arranged within the side surface between the receiving surface and the base at a first height, the bulge having a bottom spaced from the base in a direction of the optical axis,
wherein the bulge covers an angular range of less than 130° of the circumference of the main body as measured from the optical axis,
wherein, in a projection along the optical axis, a shadow of the main body has a first diameter, and
wherein a shadow of the lens formed of the main body and the at least one bulge in a projection along the optical axis completely fits in a square having an edge length corresponding to the diameter.

14. The lens according to claim 1, wherein the lens is a single lens.

* * * * *